US009245810B2

(12) United States Patent
Dale et al.

(10) Patent No.: US 9,245,810 B2
(45) Date of Patent: Jan. 26, 2016

(54) ELECTRICAL AND OPTO-ELECTRICAL CHARACTERIZATION OF LARGE-AREA SEMICONDUCTOR DEVICES

(75) Inventors: Phillip Dale, Luxembourg (LU); Susanne Siebentritt, Luxembourg (LU)

(73) Assignees: UNIVERSITE DU LUXEMBOURG, Luxembourg (DE); TDK CORPORATION, Tokyo (JP)

( * ) Notice: Subject to any disclaimer, the term of this patent is extended or adjusted under 35 U.S.C. 154(b) by 1064 days.

(21) Appl. No.: 13/266,948

(22) PCT Filed: Apr. 27, 2010

(86) PCT No.: PCT/EP2010/055657
§ 371 (c)(1),
(2), (4) Date: Jan. 31, 2012

(87) PCT Pub. No.: WO2010/125078
PCT Pub. Date: Nov. 4, 2010

(65) Prior Publication Data
US 2012/0139551 A1 Jun. 7, 2012

(30) Foreign Application Priority Data

Apr. 30, 2009 (LU) .......................................... 91561

(51) Int. Cl.
G01R 31/02 (2006.01)
H01L 21/66 (2006.01)
(52) U.S. Cl.
CPC ..................................... H01L 22/14 (2013.01)
(58) Field of Classification Search
None
See application file for complete search history.

(56) References Cited

U.S. PATENT DOCUMENTS 4,473,795 A * 9/1984 Wood ............................ 324/501
4,758,786 A * 7/1988 Hafeman ................. 324/754.23
(Continued)

FOREIGN PATENT DOCUMENTS

DE 4440167 A1 8/1996
EP 1136827 A2 9/2001
(Continued)

OTHER PUBLICATIONS

Machine English translation of Japanese Patent Application Publication to Inventor Katsumi Shinpo. JP 2000/049200 A, Feb. 18, 2000. Translation of pp. 2-7 created on Feb. 18, 2015.*
(Continued)

Primary Examiner — Vincent Q Nguyen
(74) Attorney, Agent, or Firm — Foley & Lardner LLP

(57) ABSTRACT

The present invention relates to an electrical and/or opto-electrical characterisation method for testing large-area semiconductor devices in production, the method comprising the steps of providing a first electrode and placing it into electrical contact with a contact area of a conducting layer of a semiconductor device; providing a movable electrode assembly, comprising a container holding an electrolyte solution and at least a second electrode; immersing the second electrode into the electrolyte solution; positioning the electrode assembly such that the electrolyte solution places the second electrode into electrical contact with a top surface of the semiconductor device; and scanning the movable electrode assembly relative to the top surface of the semiconductor device while performing electrical measurements. It also relates to a corresponding electrical and/or opto-electrical characterisation device comprising a first electrode, a movable electrode assembly with a container holding an electrolyte solution and a second electrode immersed into it and scanning means.

15 Claims, 4 Drawing Sheets

(56) References Cited

U.S. PATENT DOCUMENTS

| | | |
|---|---|---|
| 2003/0122558 A1 | 7/2003 | Hacke |
| 2005/0059186 A1 | 3/2005 | Kelly et al. |
| 2005/0205128 A1 | 9/2005 | Deng et al. |
| 2006/0119373 A1* | 6/2006 | Kunimune .................... 324/754 |
| 2008/0258747 A1 | 10/2008 | Kluth et al. |
| 2009/0165845 A1 | 7/2009 | Tsao et al. |

FOREIGN PATENT DOCUMENTS

| | | |
|---|---|---|
| EP | 1513171 A1 | 3/2005 |
| EP | 1947730 A1 | 7/2008 |
| JP | 57-024544 A | 2/1982 |
| JP | 2000049200 A * | 2/2000 |
| JP | 2004-241449 A | 8/2004 |
| JP | 2006-196798 A | 7/2006 |

OTHER PUBLICATIONS

Dale et al., "Deposition and Characterization of Copper Chalcopyrite Based Solar Cells Using Electrochemical Techniques," *ECS Transactions*, 6 (2007), 12 pp.

Duffy et al., "Characterisation of CdS/CdTe Heterojunctions by Photocurrent Spectroscopy and Electrolyte Electroreflectance/Absorbance Spectroscopy," *J. of Electroanalytical Chem.*, 532 (2002), pp. 207-214.

European Patent Office, International Search Report in International Patent Application No. PCT/EP10/55657, Jun. 10, 2010, 6 pp.

European Patent Office, Written Opinion in International Patent Application No. PCT/EP10/55657, Jun. 10, 2010, 8 pp.

Tributsch, Dye Sensitization Solar Cells: A Critical Assessment of the Learning Curve, *Coordination Chem. Reviews*, 248 (2004), pp. 1511-1530.

Singh et al., "Characterization of High-Photovoltage CuPc-Based Solar Cell Structures," *Solar Energy Materials & Solar Cells*, 90 (2006), pp. 798-812.

Scragg et al., "Towards Sustainable Materials for Solar Energy Conversion: Preparation and Photoelectrochemical Characterization of $Cu_2ZnSnS_4$," *Electrochem. Communications*, 10 (2008), pp. 639-642.

* cited by examiner

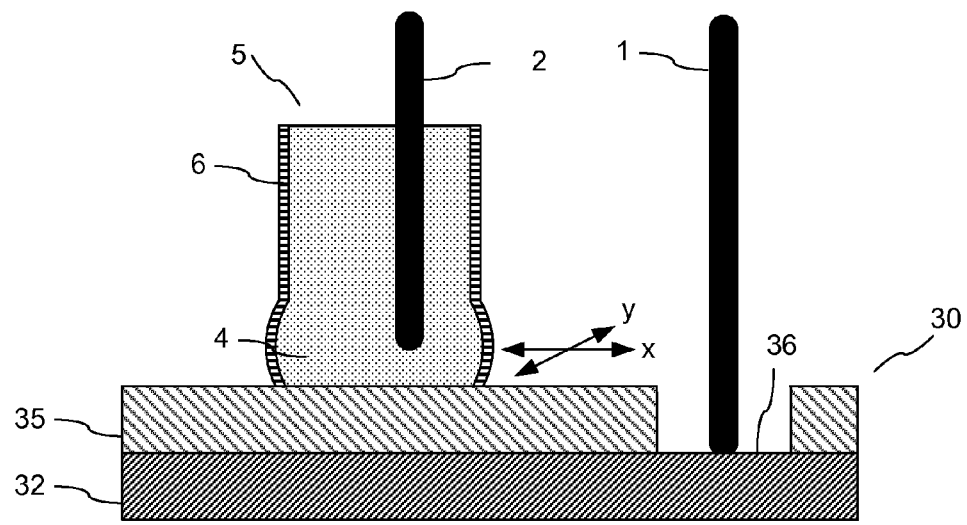
*Fig. 3*
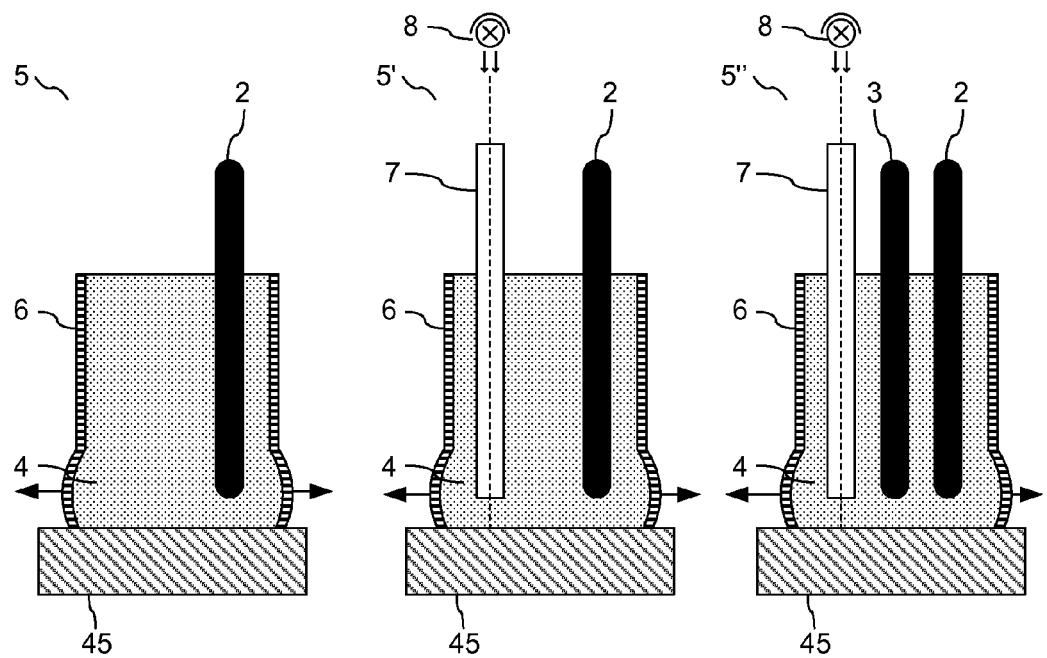
*Fig. 4A*  *Fig. 4B*  *Fig. 4C*

ELECTRICAL AND OPTO-ELECTRICAL CHARACTERIZATION OF LARGE-AREA SEMICONDUCTOR DEVICES

CROSS-REFERENCE TO RELATED APPLICATIONS

This application is the national stage of International Patent Application No. PCT/EP2010/0055657, filed on Apr. 27, 2010, claiming priority to Luxembourg Patent Application No. 91561, filed on Apr. 30, 2009, both of which are hereby incorporated by reference in their entireties.

TECHNICAL FIELD

The present invention relates to a method and device for the electrical and opto-electrical characterisation of large-area semiconductor devices. More particularly, it relates to the characterisation of such semiconductor devices in industrial production lines.

BACKGROUND OF THE INVENTION

Thin film solar cell manufacturers create expensive products consisting of a number of stacked thin layers. FIG. 1 shows an example of a solar cell in the form of a cross section of the structure of a thin film $Cu(In,Ga)(S,Se)_2$ (referred to as CIGS in the following) solar cell 1. The individual layers of the structure are deposited in sequence on a glass substrate 11. A molybdenum conducting layer 12 provides electrical contact to the backside of the structure. On top of the molybdenum is a light absorbing p-type semiconductor layer 13, which may be selected from CIGS. On top of this is a semiconductor buffer layer 14, which may be selected from CdS, and on top of this are the transparent window layers 15 and 16, comprising firstly an un-intentionally doped ZnO layer 15, and an intentionally doped zinc oxide layer 16.

All layers are important and precise control of the deposition conditions is needed to obtain the required properties from the layers to make an efficient solar device. One problem is achieving the desired control over large areas, which for solar cell applications typically may be of the order of one or more square metres.

Manufacturers would like to verify that the semiconductor layers have been deposited correctly before proceeding to complete the rest of the stack, and thus finishing the solar cell device. They could increase yield and reduce waste in their manufacturing process if they could determine whether the opto-electronic properties of the semiconductors deposited were suitable, over all areas. Typical problems in large-scale manufacturing are inhomogeneous depositions and or inhomogeneous heating during annealing.

A typical solar cell production process is shown in FIGS. 2a through 2f. In a first step (a), a molybdenum conducting layer 22 serving as a back electrode is deposited on a glass substrate 21 (FIG. 2a). A subsequent P1 scribe in step (b) removes the Mo layer 22 in a defined area (FIG. 2b). In a third step (c), the light-absorbing $Cu(In,Ga)(S,Se)_2$ p-type semiconductor layer 23 is deposited (FIG. 2c). Thereafter, buffer layers such as cadmium sulphide layer 24 are deposited in step (d), as shown in FIG. 2d, Subsequently, in step (e) the transparent window layer 25 comprising un-intentionally doped zinc oxide is deposited on top of the CdS buffer layer 24 (FIG. 2e). A final P2 scribe in step (f) removes all deposited layers 23 through 25 until the Mo conducting layer 22 is exposed in a defined area 26 (FIG. 2f). Not shown in FIG. 2, a final intentionally doped zinc oxide layer may be added to the stack connecting two individual cells.

To know whether the semiconductor layer(s) will perform correctly in the solar cell device manufacturers currently use indirect measurements to ascertain that the material has particular properties which can be linked to particular performance characteristics. Two indirect measurements of absorber layer semiconductor material quality are known: Raman spectroscopy and life time photoluminescence. It is found that the width of a characteristic Raman response peak of Cu(In,Ga)(S,Se2) correlates with the final maximum voltage that the device will be able to produce. Also, the life time of luminescence of the absorber layer after excitation with a laser correlates to final device performance. Furthermore, the conductivity of the absorber layer may be measured by mechanically pressing against the absorber layer and measuring its conductivity.

At the moment there is no direct inline method for determining how much electrical current the device will produce, what part of the solar spectrum the device will absorb (band gap of device), and what voltage the finished cell will have. Currently, to determine these properties the semiconductor layers must be physically electrically contacted both on the front and back sides. The p-type semiconductor backside is normally deposited on top of a conducting substrate or conducting layer providing a contact at the back. However, the semiconductor front side must also be contacted to allow for testing.

One way to contact the semiconductor front side is to use a solution which is electrically conducting, which itself can be "contacted" by an external electrode, such as platinum. The solution provides a transparent electrical contact which investigative light can be passed through to interrogate the semiconductor. This general technique is known as "photoelectrochemistry" and is somewhat known in the literature (Dale P J et al., 2007 ECS transactions 6; and Duffy N W et al., 2002 J. Electroanal. Chem. 532 207-14). Once the semiconductor is electrically contacted, light can be shone on to it and the opto-electrical properties of the layer can be established. The key advantage is that this solution provides a front side contact which is extremely easy to remove, e.g. by just washing it away, or if the contacting solution is chosen correctly, could form part of the cell making process.

However, the photoelectrochemical techniques described above are limited to the laboratory scale ($1 \times 1$ $cm^2$ for example) but not on large areas such as metre squared, as actually used in industrial production processes.

TECHNICAL PROBLEM TO BE SOLVED

The present invention aims to overcome or at least alleviate the disadvantages of the characterisation methods and apparatus known from the prior art. The present invention also aims to provide an electrical and/or opto-electrical characterisation method that can be used during the production of large-area semiconductor devices.

SUMMARY OF THE INVENTION

According to a first aspect, the present invention proposes an electrical and/or and opto-electrical characterisation method for testing large-area semiconductor devices in production, the method comprising the steps of:

providing a first electrode and placing it into electrical contact with the contact area of a conducting layer of a semiconductor device;

providing a movable electrode assembly comprising a container holding an electrolyte solution and at least a second electrode, and immersing the second electrode into the electrolyte solution, positioning the electrode assembly such that the electrolyte solution places the second electrode into electrical contact with a top surface of the semiconductor device;

scanning the movable electrode assembly relative to the top surface of the semiconductor device while performing electrical measurements.

The method may further comprise the step of providing an optical wave-guide, and immersing the wave guide in the electrolyte solution, placing it in vicinity of the top surface of the semiconductor device.

The method may further comprise the step of providing pulsed illumination to the wave-guide.

The method may further comprise providing a third electrode, immersing the third electrode into the electrolyte solution that places it into electrical contact with the top surface of the semiconductor device.

The electrical measurements may comprise photoelectric measurements.

The electrolyte solution may be a solution of europium.

The step of scanning the movable electrode assembly relative to the surface of the semiconductor device may comprise moving the movable electrode assembly.

The step of scanning the movable electrode assembly relative to the surface of the semiconductor device may comprise moving the first electrode in conjunction with the electrode assembly.

According to a second aspect of the present invention, a device for the electrical and/or opto-electrical characterisation of large-area semiconductor devices in production comprises:

a first electrode adapted for being placed into electrical contact with a contact area of a conducting layer of a semiconductor device;

a movable electrode assembly, comprising a container holding an electrolyte solution and at least a second electrode, the second electrode immersed into the electrolyte solution for placing the second electrode into electrical contact with the top surface of the semiconductor device;

scanning means adapted for moving the electrode assembly across the surface of the semiconductor device while performing electrical measurements.

The movable electrode assembly may further comprises an optical wave guide optically connectable to a light source.

The movable electrode assembly may further comprises a third electrode, the third electrode immersed into the electrolyte solution for placing it into electrical contact with the top surface of the semiconductor device.

The wave guide may receive pulsed illumination from a light source.

The electrolyte solution may be a solution of europium.

The first electrode may be adapted for being moved together with the electrode assembly whilst scanning the top surface of the semiconductor device.

The first electrode may be one of a mechanical scribe or a separate electrode following a scribe.

BRIEF DESCRIPTION OF THE DRAWINGS

FIG. 3 shows a first embodiment of the present invention.

FIGS. 4A to 4C show advantageous embodiments of the electrode assembly.

DETAILED DESCRIPTION OF THE INVENTION

Figure 1:
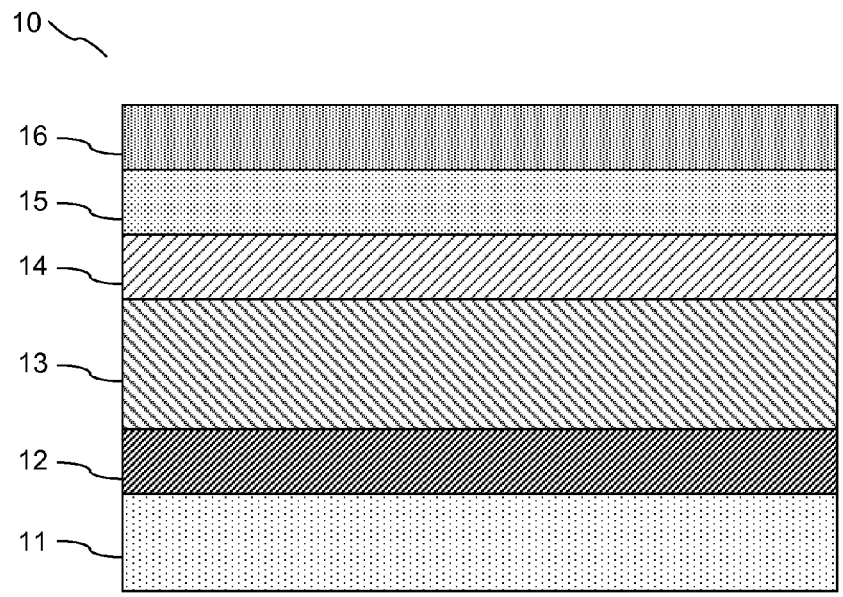
FIG. 1 shows a schematic cross-section of the structure a thin film Cu(In,Ga)(S,Se)$_2$ solar cell.

The present invention proposes utilising photoelectrochemistry to characterise large area solar cells known as modules for electric and/or opto-electrical characterisation during the production process.

FIG. 3 illustrates schematically how a module could be tested mid production process in accordance with the present invention. A back contact to a first conducting layer 32 is made by a first electrode 1 through a contact area, or contact window, 36, in which the conducting layer is directly accessible. The contact window 36 could advantageously be a Molybdenum P2 scribe path, either by utilizing the mechanical scribe itself as the first electrode 1, or by using a dedicated electrode 1 following it. An electrolyte solution 4 is held within a tube or container 6 which also comprises a second electrode 2. The tube 6 is placed on top of the surface of the semiconductor device, such that the electrolyte solution 4 provides the electrical contact between the top surface 35 of the semiconductor device 30 and the second electrode 2. The top electrode assembly 5 can then be scanned across the surface 35 of the semi-completed module 30, in a plane parallel to its top surface 35, to characterise its electrical performance.

The present invention proposes an electrical and/or opto-electrical characterisation method for testing semiconductor devices in production. The semiconductor device comprises a conducting layer 32. This conducting layer may either be a first metallic contact layer, such as Mo, or a conducting substrate. The semiconductor device further comprises at least one semiconductor layer 35 deposited on the conducting layer. At least a first contact area or contact window 36' is provided, such that the conducting layer 32 of the semiconductor device can be contacted electrically. It is of course understood that the invention is equally applicable to the semiconductor device comprising several layers.

The electrode assembly 5 shown in FIG. 3 and FIG. 4A, while providing for the scanning of large areas, allows current-voltage characteristics to be measured.

A more advantageous electrode assembly 5' that allows opto-electrical measurements to be carried out, is shown in FIG. 4B. In addition to the second electrode 2, an optical wave guide 7 is provided such that its proximal end can be coupled to a light source 8. The distal end of the wave guide 7 is positioned low in the tube 6 which contains the electrolyte solution and enables light to be shone onto the top surface of semiconductor layer 45. While the light source 8 may provide continuous light, it is usually preferred to use a pulsed light source when performing the opto-electrical characterisation of semiconductor devices. When the light source 8 provides pulsed illumination, e.g by using a chopper 74, photoelectric measurements can be carried out. Such measurements can comprise, but are not limited to: dark current, light induced current as a function of wavelength, and or light intensity.

FIG. 4C illustrates a preferred embodiment of electrode assembly 5", in which a third electrode 3 is arranged in tube 6 in addition to the second electrode 2 and the optical wave guide 7. The electrolyte solution 4 contained in the tube 6 also establishes an electrical contact between electrode 3 and the top surface of the semiconductor layer 45. The third electrode 3 may advantageously be used to influence the electrical potential at the surface of the semiconductor device.

It is advantageous to identify a suitable electrolyte 4 e.g. via its redox potential. For a CIGS, CdS, and i-ZnO surface, a preferred electrolyte solution is a solution of europium. It is moreover of advantage that the electrolyte be easily removable from the semiconductor surface.

If applicable, the electrolyte 4 could preferably contain ions the same as those used in the following semiconductor layer.

The present invention foresees that a first electrode 1 is placed into electrical contact with the first contact area 56 of the conducting layer 52. FIGS. 5A to 5D show examples of how the electrical contact may be established.

Figure 5A:
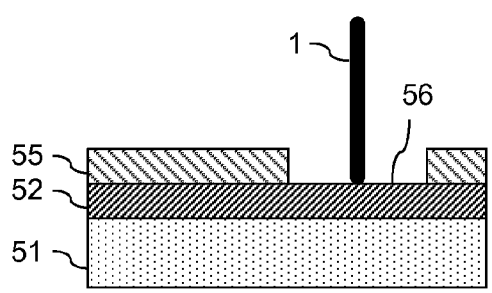
FIGS. 5A to 5D show advantageous embodiments of the first electrode.

In FIG. 5A, a conducting layer 52 is deposited on top of a non-conducting substrate 51. A contact window 56 is provided in the at least one semiconductor layer 55 deposited on top of conducting layer 52. First electrode 1 establishes the electrical contact to the conducting layer 52 within the confines of contact window 56.

Figure 5B:
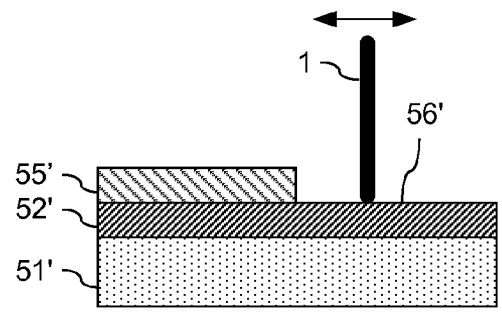

FIG. 5B shows a very similar semiconductor in which non-conducting substrate 51', conducting layer 52' and at least one semiconductor layer 55' are as describe with reference to FIG. 5A. The contact area 56', however, is elongated and allows the first electrode to move along exposed part of the conducting layer 52'.

Figure 5C:
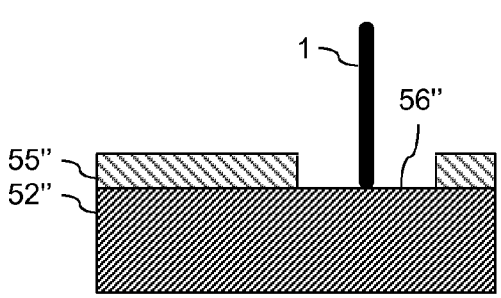

A conducting substrate 52" is shown in FIG. 5C, on top of which at least one semiconductor layer 55" has been deposited. A contact area 56" exposes the top surface of conducting layer 52", which is contacted by the first electrode 1".

Figure 5D:
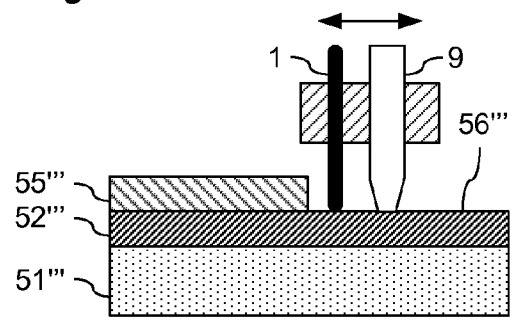

A further embodiment is shown in FIG. 5D, in which non-conducting substrate 51''' carries a conducting layer 52''' whose top surface is exposed in a contact area 56'''. At least one semiconductor layer 55''' is deposited on top of conducting layer 52'''. A mechanical scribe 9, mechanically coupled to and followed by, first electrode 1 moves along the exposed surface of conducting layer 52 in the elongated contact area 56.

Figure 6A:
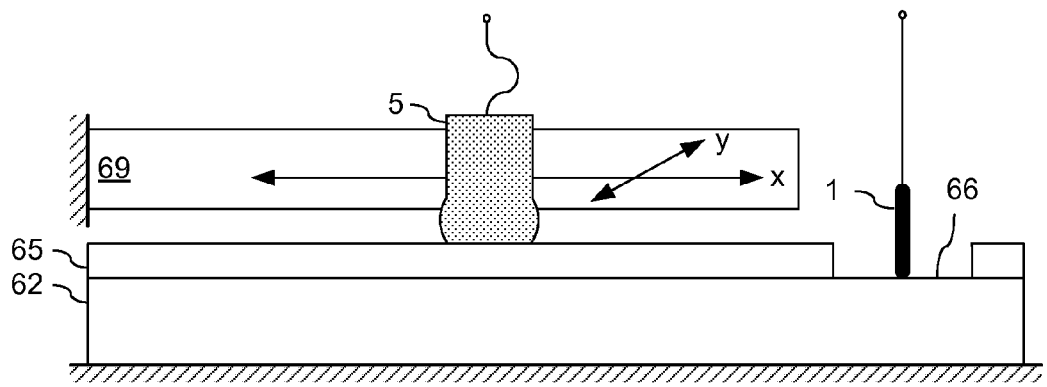
FIGS. 6A and 6B show advantageous embodiments of the means for moving the electrode assembly relative to the surface of the semiconductor device.

As shown in the embodiment of FIG. 6A, the step of scanning the movable electrode assembly relative to the surface of the semiconductor device may comprise moving the movable electrode assembly e.g. via a suitably controlled X-Y table 69. The semiconductor device is then held in place while the electrode assembly moves across its top layer 65. When the electrode assembly 5 is movable, its electrical and optical connections need to be provided in flexible form, allowing for movement.

Figure 6B:
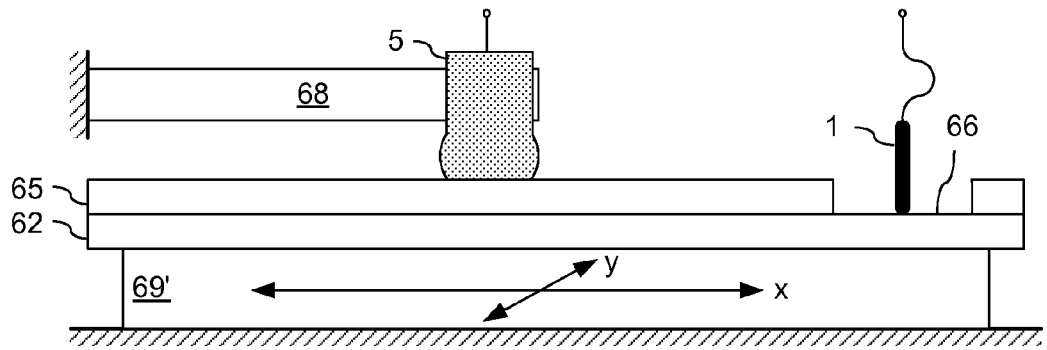

A further embodiment provides for moving the semiconductor device, e.g. via a suitably controlled X-Y table 69', as illustrated in FIG. 6B. This also results in a relative movement of the semiconductor device with respect to the electrode assembly 5.

In the embodiments shown in FIGS. 6A and 6B, a linear displacement device may be sufficient, however, a X-Y table, or any other device allowing movement in at least two dimensions, is a preferred means for effecting the required movement for scanning the electrode assembly 5 across the semiconductor device.

Figure 2:
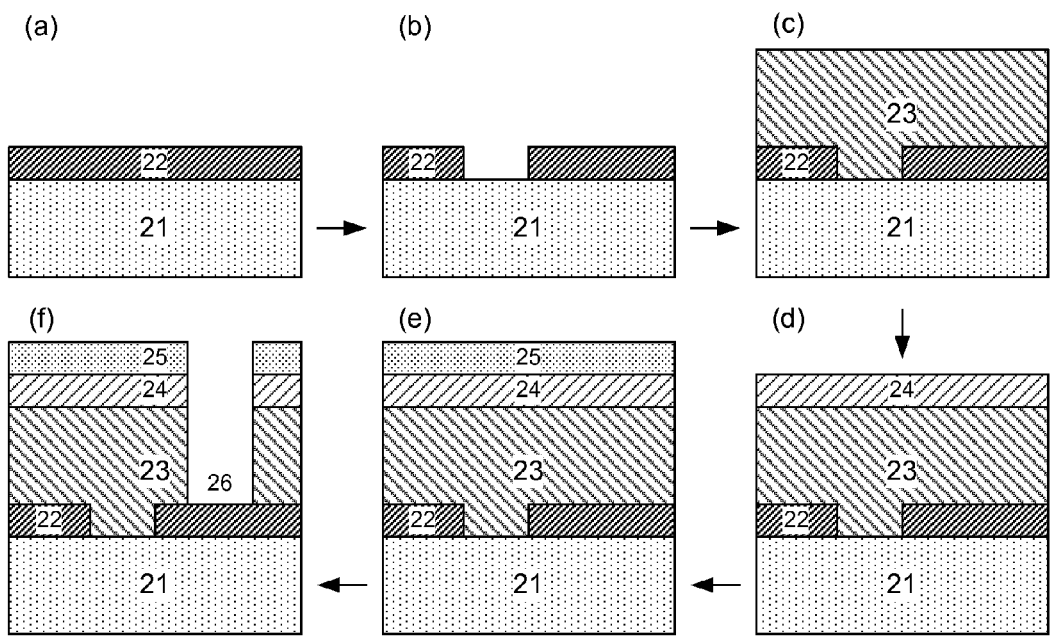
FIG. 2 shows a typical Cu(In,Ga)(S,Se)$_2$ production process.
Figure 7:
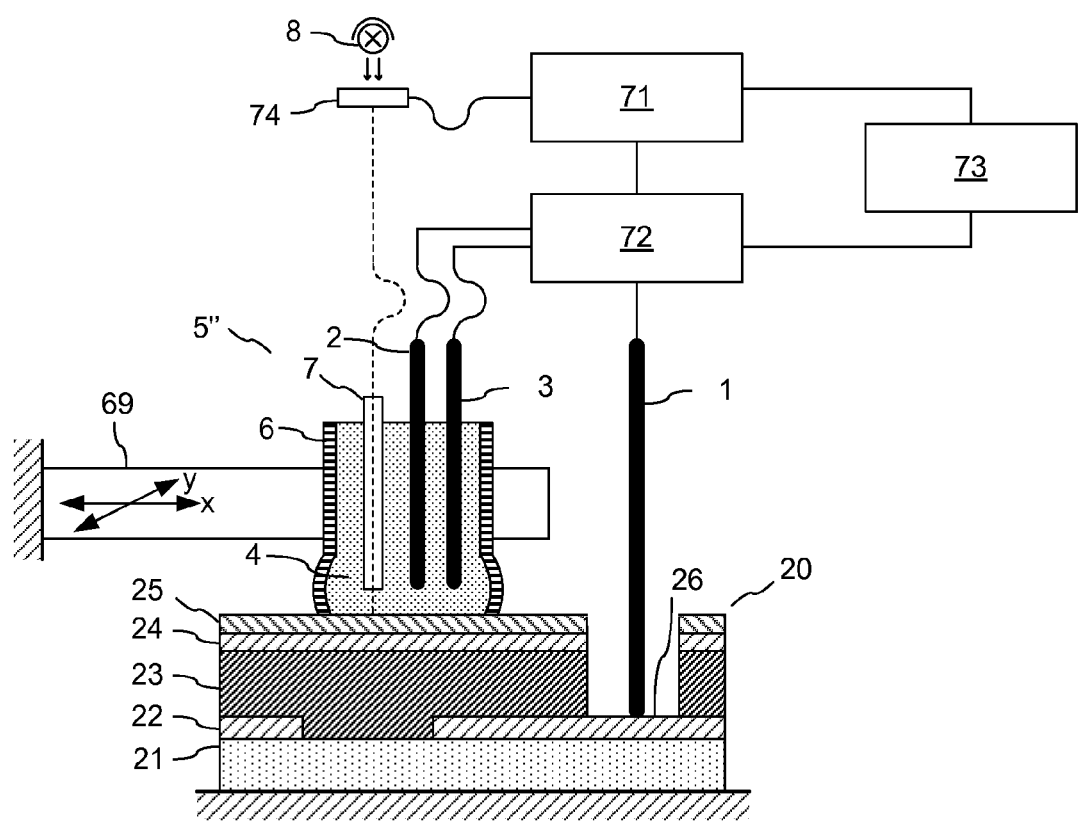
FIG. 7 shows a preferred complete set-up for photo-electric characterisation of semiconductor devices in a production line.

FIG. 7 shows a preferred complete set-up for the optoelectrical characterisation of the large-area semiconductor device 20 discussed with reference to FIG. 2 in an industrial production process. The first electrode 1 is used to establish a stable electrical contact to a contact window 26 provided on top of a first conducting layer 22. The contact to the semiconductor layer 22 is may e.g. be made through the Molybdenum P2 scribe path, either by utilizing the mechanical scribe itself as the first electrode 1 or by providing a dedicated electrode 1 following it.

The semiconductor device 20 further comprises a light absorbing layer 23 and a buffer layer 24. A transparent window layer 25 is deposited on top of the semiconductor device 20.

The electrolyte solution 4 is held within a tube which also contains the optical waveguide and second and third electrodes 2 and 3. For a CIGS system, the electrode is selected from europium. The electrode assembly 5 can be scanned across the surface of the semi-completed module 20 to characterise its performance. The scanning movement is in a plane parallel to the top surface of the semiconductor device, maintaining the contact between the electrode assembly 5 and the top surface.

This embodiment further comprises a lock-in amplifier 71, a potentiostat 72 and a computer 73 for controlling the measurement. The light emitted by light source 8 passes through a chopper 74, which in turn is linked to the lock in amplifier 71. The pulsed light then passes through the waveguide 7 and is shone onto the top of the semiconductor device. An X-Y table 69 is used for displacing the electrode assembly 5 relative to the semiconductor device 20. In the embodiment shown in FIG. 7, it is the electrode assembly 5 that remains in a static position, while the semiconductor device 20 is moved by X-Y table 69.

In an alternative embodiment, the semiconductor device could be moved, whereas the electrode assembly would then remain in a fixed position.

Advantages

The electrical and/or opto-electrical characterisation of large-area semiconductor devices according to the present invention may facilitate obtaining information, which could previously not be obtained by the hitherto known indirect methods, namely:

1. Quantum efficiency data as a function of wavelength which allows
    a. Calculation of device short circuit current.
    b. Calculation of absorber layer band gap
    c. Estimation of electrical carrier life time.
    d. If the CdS layer is measured, estimation of CdS thickness
2. Measurement of voltage generated across junction which is indicative of cell voltage which can be achieved.
3. Magnitude of dark current indicates pinholes/conducting sub phases All of this information would be useful to manufacturers in determining whether the material is suitable to be completed into full devices, and can be made as a function of position on the module. The electrical characterisation according to the present invention may be used as an early warning for manufacturers that they have a problem in their process. This type of characterisation is suitable for all types of thin film inorganic solar cells including CdTe, $CuInS_2$ based devices.

The present invention allows electrical and/or opto-electrical measurements to be performed, and the characterisation is suitable to be used in the semiconductor production line.

If a scribe is used, it may be advantageous to move the first electrode 1 in conjunction with the scribe. Where the scribe is mechanical and of conducting material, the mechanical scribe could be used as the first electrode 1.

A further advantage arises when the first electrode 1 is moved together with the electrode assembly 5 while performing the electrical measurements.

While the invention has been described based on the CIGS solar cell modules, it will be appreciated that the invention is not limited to these specifications. The invention may equally well be applied to other solar cells and/or other material systems. Likewise, other electrical characterisation methods may be used.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. An electrical and/or opto-electrical characterization method for testing and manufacturing large-area semiconductor devices in production, the method comprising the steps of:
   providing a first electrode and placing it into electrical contact with a contact area of a conducting layer of a semiconductor device;
   providing a movable electrode assembly, comprising a container holding an electrolyte solution and at least a second electrode, immersing the second electrode into the electrolyte solution,
   positioning the electrode assembly such that the electrolyte solution places the second electrode into electrical contact with a top surface of the semiconductor device, the top surface of the semiconductor device comprised of a conductive semiconductor material; and,
   scanning the movable electrode assembly relative to the top surface of the semiconductor device while performing electrical measurements.

2. The method of claim 1, further comprising the step of providing an optical wave-guide, and immersing the wave guide in the electrolyte solution, placing it in vicinity of the top surface of the semiconductor device.

3. The method of claim 2, further comprising the step of providing pulsed illumination to the wave-guide.

4. The method of claim 2, wherein the electrical measurements comprise photoelectric measurements.

5. The method of claim 1, further comprising the step of providing a third electrode and immersing the third electrode into the electrolyte solution for placing it into electrical contact with the top surface of the semiconductor device.

6. The method of claim 1, wherein the electrolyte solution is a solution of europium.

7. The method of claim 1, wherein the step of scanning the movable electrode assembly relative to the surface of the semiconductor device comprises moving the movable electrode assembly.

8. The method of claim 7, wherein the step of scanning the movable electrode assembly relative to the surface of the semiconductor device comprises moving the first electrode in conjunction with the electrode assembly.

9. A device for the electrical and/or opto-electrical characterization of semiconductor devices in production, comprising:
   a first electrode capable of being placed into electrical contact with a contact area of a conducting layer of a semiconductor device;
   a movable electrode assembly comprising a container holding an electrolyte solution and at least a second electrode, the second electrode immersed into the electrolyte solution for placing the second electrode into electrical contact with the top surface of the semiconductor device, the top surface of the semiconductor device comprised of a conductive semiconductor material; and,
   a scanning mechanism connected to the moveable electrode assembly, said scanning mechanism capable of moving the movable electrode assembly across the surface of the semiconductor device while performing electrical measurements.

10. The device of claim 9, wherein the movable electrode assembly further comprises an optical wave guide optically connectable to a light source.

11. The device of 10, wherein the wave guide receives pulsed illumination from a light source.

12. The device of claim 9, wherein the movable electrode assembly further comprises a third electrode, the third electrode immersed into the electrolyte solution for placing it into electrical contact with the top surface of the semiconductor device.

13. The device of claim 9, wherein the electrolyte solution is a solution of europium.

14. The device of claim 9, wherein the first electrode is adapted for being moved together with the electrode assembly whilst scanning the top surface of the semiconductor device.

15. The device of claim 9, wherein the first electrode is one of a mechanical scribe or a separate electrode following a scribe.

* * * * *